(12) United States Patent
Chakrabarti et al.

(10) Patent No.: US 10,148,270 B2
(45) Date of Patent: Dec. 4, 2018

(54) SWITCHABLE POWER ISLANDS HAVING CONFIGURABLY ON ROUTING PATHS

(71) Applicant: QuickLogic Corporation, Sunnyvale, CA (US)

(72) Inventors: Pinaki Chakrabarti, Bangalore (IN); Wilma W. Shiao, San Jose, CA (US); Ket-Chong Yap, San Ramon, CA (US); Vishnu A. Patil, Bangalore (IN); Lalit Narain Sharma, Bengaluru (IN)

(73) Assignee: QuickLogic Corporation, Sunnyvale, CA (US)

( * ) Notice: Subject to any disclaimer, the term of this patent is extended or adjusted under 35 U.S.C. 154(b) by 0 days.

(21) Appl. No.: 15/658,206

(22) Filed: Jul. 24, 2017

(65) Prior Publication Data
US 2018/0269879 A1    Sep. 20, 2018

(30) Foreign Application Priority Data
Mar. 15, 2017   (IN) .............................. 201741008891

(51) Int. Cl.
*H03K 19/177*   (2006.01)
*G06F 17/50*    (2006.01)

(52) U.S. Cl.
CPC ... *H03K 19/17744* (2013.01); *G06F 17/5072* (2013.01); *G06F 17/5077* (2013.01); *H03K 19/17784* (2013.01)

(58) Field of Classification Search
CPC ........ H03K 19/17744; H03K 19/17784; G06F 17/5072; G06F 17/5077

USPC .................................................... 326/41, 47
See application file for complete search history.

(56) References Cited

U.S. PATENT DOCUMENTS

| 6,148,390 | A | * | 11/2000 | MacArthur ...... H03K 19/17728 365/201 |
| --- | --- | --- | --- | --- |
| 6,208,171 | B1 | * | 3/2001 | Kumagai ........... H03K 19/0016 326/121 |
| 7,080,341 | B2 | | 7/2006 | Eisenstadt et al. |
| 7,562,332 | B1 | * | 7/2009 | Tuan ................ H03K 19/17784 716/138 |
| 7,714,610 | B2 | | 5/2010 | He |
| 7,904,838 | B2 | | 3/2011 | Balatsos et al. |
| 8,183,661 | B2 | | 5/2012 | Lou |
| 9,276,573 | B2 | | 3/2016 | Gaillardon et al. |
| 2005/0091629 | A1 | * | 4/2005 | Eisenstadt ............. G06F 17/505 326/81 |
| 2006/0093129 | A1 | | 5/2006 | Redorta et al. |
| 2014/0333134 | A1 | | 11/2014 | Hoberman et al. |
| 2016/0049941 | A1 | | 2/2016 | How et al. |

* cited by examiner

*Primary Examiner* — Daniel D Chang
(74) *Attorney, Agent, or Firm* — Silicon Valley Patent Group LLP

(57) ABSTRACT

A programmable logic device uses power island based design partitioning. Each power islands includes a plurality of programmable logic cells and a programmable routing network configurable to interconnect the plurality of programmable logic cells and configurable to interconnect with at least one other power island. When a power island is in an OFF state, the programmable logic cells within the power island are powered OFF. Feed-through routing connectors in the power island, however, may be statically or dynamically powered ON independently of the powered OFF state of the power island.

19 Claims, 4 Drawing Sheets

US 10,148,270 B2

SWITCHABLE POWER ISLANDS HAVING CONFIGURABLY ON ROUTING PATHS

TECHNICAL FIELD

The present invention relates to programmable logic devices, and more specifically to maintain functionality of a feedthrough routing path travelling across different switchable power islands in a programmable logic devices.

BACKGROUND

A programmable logic device, sometimes referred to as programmable application specific integrated circuit (PASIC), field programmable gate array (FPGA), or complex programmable logic device (CPLD), is a versatile integrated circuit chip, the internal circuitry of which may be configured by an individual user to realize a user-specific circuit design. To configure a programmable logic device, the user configures an on-chip interconnect structure of the programmable logic device so that selected input terminals and selected output terminals of selected on-chip circuit components are electrically connected together in such a way that the resulting circuit is the specific circuit design desired by the user.

The architecture of programmable logic devices, which includes logic cells and a routing network, is such that many different circuit designs may be implemented by appropriately programming the programmable logic device. Moreover, unlike application specific integrated circuits (ASICs), there is no one specific circuit design that is to be implemented with the programmable logic device. Thus, while ASIC devices can accommodate specific power conservation designs using different and/or multiple custom sized power islands, it is not possible to fabricate a generic programmable logic device with custom sized circuit specific power conservation designs.

SUMMARY

A programmable logic device uses power island based design partitioning. Each power islands includes a plurality of programmable logic cells and a programmable routing network configurable to interconnect the plurality of programmable logic cells and configurable to interconnect with at least one other power island. When a power island is in an OFF state, the programmable logic cells within the power island are powered OFF. Feed-through routing connectors in the power island, however, may be statically or dynamically powered ON independently of the powered OFF state of the power island.

In one implementations, a programmable logic device includes a plurality of power islands, each power island comprising a plurality of programmable logic cells and a programmable routing network configurable to interconnect the plurality of programmable logic cells and configurable to interconnect with at least one other power island, wherein the plurality of power islands comprises at least one power island that is powered ON; and a powered OFF power island, wherein the plurality of logic cells in the powered OFF power island are powered OFF and at least one routing connector in the programmable routing network of the powered OFF power island is powered ON.

In one implementation, a programmable logic device includes a plurality of programmable logic cells; and a programmable routing network configurable to interconnect the plurality of programmable logic cells; wherein the plurality of programmable logic cells and the programmable routing network is partitioned into a plurality of power islands, wherein the programmable logic cells within a power island are powered OFF when the power island is in a powered OFF state, and wherein feed-through routing connectors in the programmable routing network within the power island are configurable to statically or dynamically be powered ON independently of the powered OFF state of the power island.

BRIEF DESCRIPTION OF THE DRAWINGS

FIG. 4 illustrates a programmable logic device with a power island powered OFF, while the remaining power islands are powered ON.

DETAILED DESCRIPTION

Figure 1:
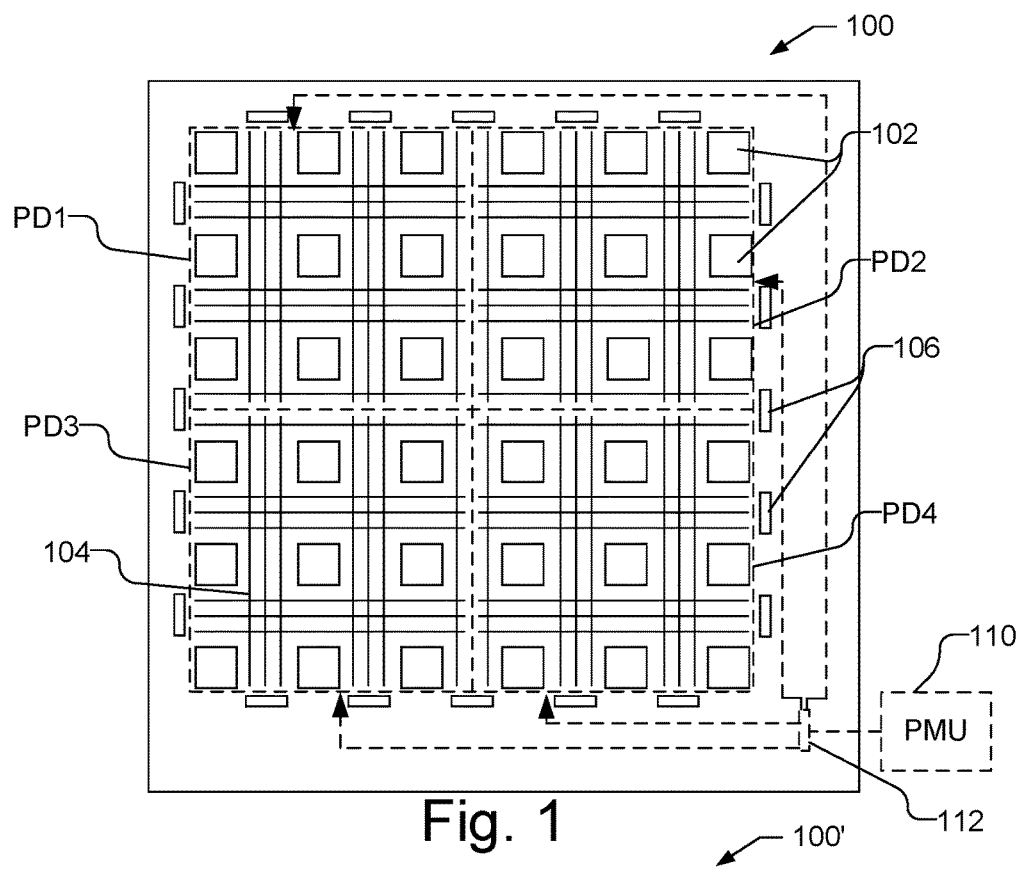
FIG. 1 shows a schematic view of an islanded programmable logic device.

FIG. 1 shows a schematic view of an islanded programmable logic device 100, such as a programmable application specific integrated circuit (PASIC), field programmable gate array (FPGA) or complex programmable logic device (CPLD) or similar devices, that uses switchable power islands and configurable routing paths. Programmable device 100 is illustrated with a number of rows and columns of logic blocks 102 with an interconnecting network 104, e.g., interconnecting wires, shown schematically as horizontal and vertical lines. Programmable device 100 may have more or fewer logic blocks 102 than is illustrated in FIG. 1. A number of peripheral logic 106, which may be, e.g., random access memory or input/output ("I/O") terminals (sometimes referred to herein as RAM 106 or I/O terminals 106), are also shown in FIG. 1 connected to the interconnecting network 104. The network switches in each logic block 102 may include programmable elements, such as SRAM, EPROM, etc. that may be programmed to interconnect desired logic blocks 102 and peripheral logic 106 in various configurations as desired by the user.

Figure 2:
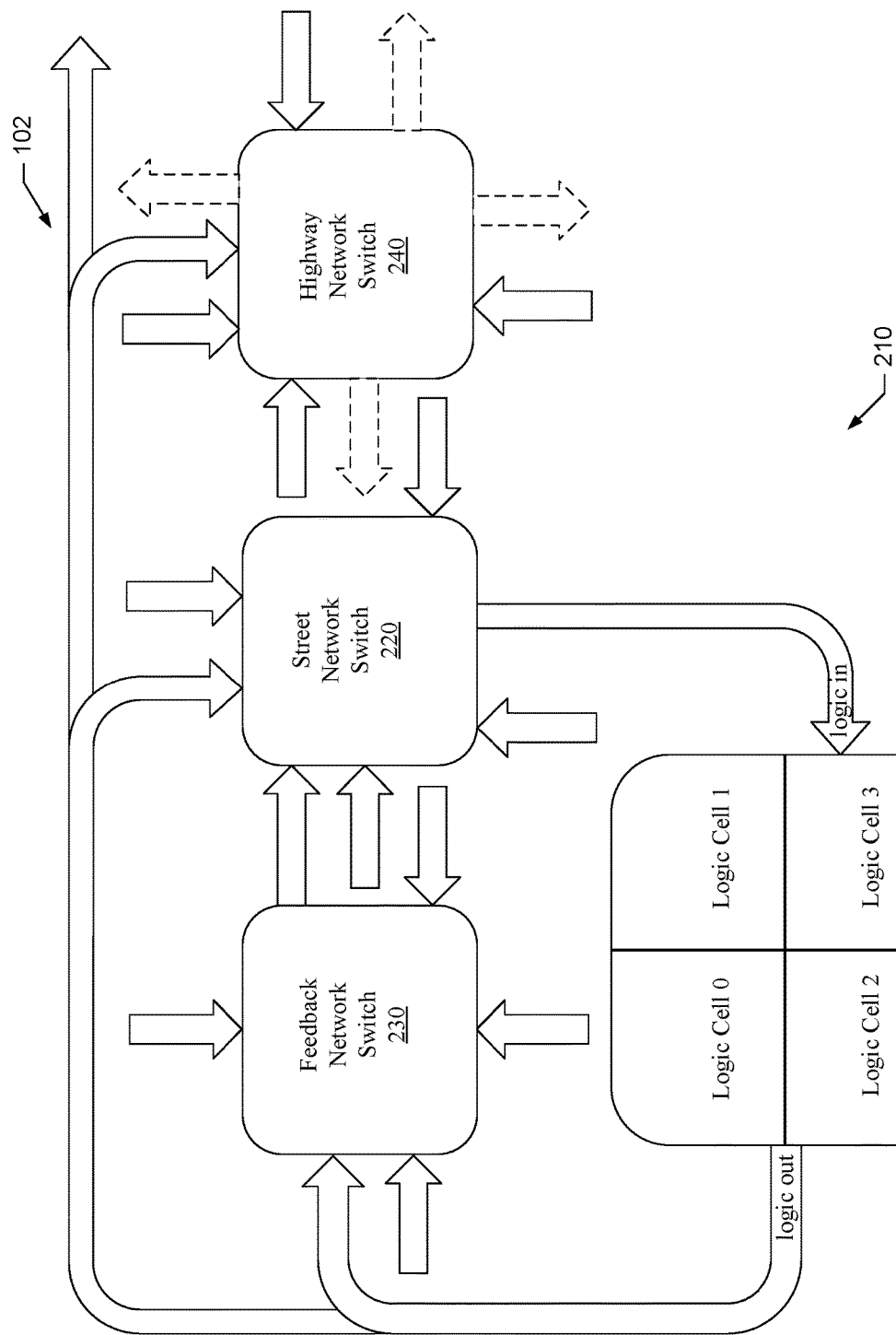
FIG. 2 is a block diagram illustrating a single logic block that may be included in the programmable logic device shown in FIG. 1.

FIG. 2 is a block diagram illustrating a single logic block 102 that may be included in the programmable logic device 100 shown in FIG. 1. The logic block 102 is illustrated as including a plurality of logic cells 200, labeled logic cell 0, logic cell 1, logic cell 2, and logic cell 3. The logic block 102 may further include a routing network 210 that may include, e.g., one or more network switches, such as a street network switch 220, a feedback network switch 230, and a highway network switch 240, and may include additional switches and accompanying routing connectors, e.g., wires and programmable elements, such as SRAMs, EPROMs, etc., that may be programmed to interconnect desired logic blocks 102 and peripheral logic 106 in various configurations as desired by the user. As illustrated, the logic cells 200 receive input data (logic in) from the street network switch 220 and produces output data (logic out) to the feedback network switch 230, the street network switch 220, and the highway network switch 240. The feedback network switch 230, the street network switch 220, and the highway network switch 240 may also receive data from neighboring logic blocks. It should be understood, however, that logic block 102 is provided merely for illustrative purposes and that the programmable logic device 100 may use logic blocks other than the logic block 102 shown in FIG. 2, including, but not limited to a logic block with a single logic cell and only street and highway networks and no feedback network.

Programmable logic device 100 uses predefined power island based design partitioning to allow some degree of power conservation design. Unlike ASICs, in which the shape and size of power islands of a power conservation design may be derived from any specific circuit module, programmable logic devices do not have a specific circuit design, but use logic cells and routing paths that are predefined and which may be programmed to implement a circuit design. Accordingly, circuit module specific derivation of power islands in a programmable logic device is not possible.

The use of power islands can potentially lower the power consumption of a device, particularly, static power, however, the amount of power that can be reduced depends primarily on the switching behavior of the power islands. Statically powering OFF or ON the power islands of the programmable logic device based on the actual utilization of the programmable logic cells in a user defined circuit design may yield power reduction, however, when the programmable logic cells of the programmable logic device are highly utilized, this method is not only ineffective, but also may cause more power consumption than a non-power-islanded programmable logic device, due to the additional special cells, e.g. isolation cells, that need to be added as part of the architecture of the power-islanded programmable logic device.

Power State Table (PST) based switching of the power islands, e.g., controlled by Power Management Unit (PMU), is a more effective way to ensure power saving, even when the programmable logic cells of the programmable logic device are fully utilized.

In a power conservation design using a predefined power islanded programmable logic device, even though the logic and communicating nets of a design module are typically confined within a respective power island, inter-power island communication and/or communication with peripheral logics are common and cannot be avoided. In such situation, the routing/communicating nets may need to travel through a powered off power island by the use of feed-through routing connectors. Accordingly, the feed through routing connectors of programmable logic device 100 are configured to be dynamically or statically powered ON or OFF, e.g., by a PMU or by static configuration bits.

As illustrated with dotted lines in FIG. 1, the programmable device 100 includes a plurality of power islands PD1, PD2, PD3, and PD4. It should be understood that while four power islands are illustrated, the programmable device 100 may include a greater or lesser number of power islands. Each power island includes a plurality of logic blocks 102, and thus, includes a plurality of programmable logic cells and a programmable routing network that is configurable to interconnect the plurality of programmable logic cells and configurable to interconnect with at least one other power island. The power supplied to each of the power islands PD1, PD2, PD3, and PD4 may be controlled, e.g., with an on-board or off the board Power Management Unit (PMU), or by a configuration bit. Control of the power supply to each of the power islands PD1, PD2, PD3, and PD4 provides flexibility to attain lower power consumption in a power conversation design implementation, e.g., based on static or dynamically controlled power supply. Additionally, the power supplied to the routing network within each of the power islands PD1, PD2, PD3, and PD4, may also be controlled, e.g., with an on-board or off the board Power Management Unit (PMU), or by a configuration bit. Control of the power supply to the routing network within each of the power islands provides flexibility to create always-ON or dynamically-ON feed-through routing whenever required in order to provide seamless communication between the two powered ON IO/logic components through a powered OFF power island.

FIG. 1, by way of example, illustrates a programmable logic device 100 with power islands PD1, PD2, PD3, and PD4 that may be controlled using a configuration bit, which may be set while programming of the programmable logic device 100. Alternatively, the power islands PD1, PD2, PD3, and PD4 of the programmable logic device 100 may be controlled with an off-board Power Management Unit (PMU) 110 (shown with broken lines), which may provide control signals to power on or power off specific power islands PD1, PD2, PD3, and PD4 and/or specific routing networks within the power islands via a dedicated I/O terminal 112 or via configurable I/O terminals 106.

Figure 3:
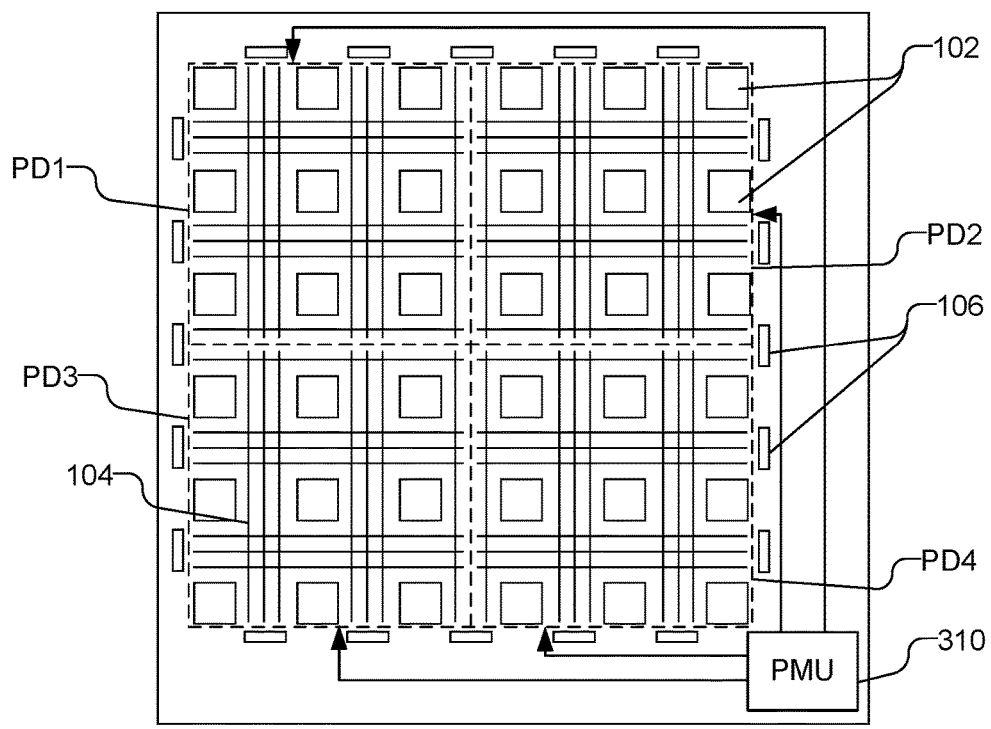
FIG. 3 illustrates a programmable logic device with an on-board Power Management Unit (PMU).

FIG. 3 illustrates a programmable logic device 100', which is similar to programmable logic device 100, like designated elements being the same. The programmable logic device 100' is illustrated in FIG. 3 with an on-board Power Management Unit (PMU) 310, that is connected to provide control signals to power on or power off specific power islands PD1, PD2, PD3, and PD4 and/or specific routing networks within the power islands. With an on board PMU, as illustrated in FIG. 3, or an off board PMU, power islands can be made dynamically switchable, e.g., based on the input from a Power State Table (PST).

The programmable logic device 100 may be divided into a fixed number, N, power islands. To implement a power conservation design onto this N-power-islanded programmable logic device, a designer may design the circuit into N or less different power domains, and keep the different power domain design modules separated. A physical synthesis tool may convert the designs into different circuit components, and a place and route (P&R) tool may place and route the circuit components of the different design modules into different corresponding power islands. After the complete design is placed and routed, any unused power island or any unused logic cells within any power island may be switched off statically.

Figure 4:
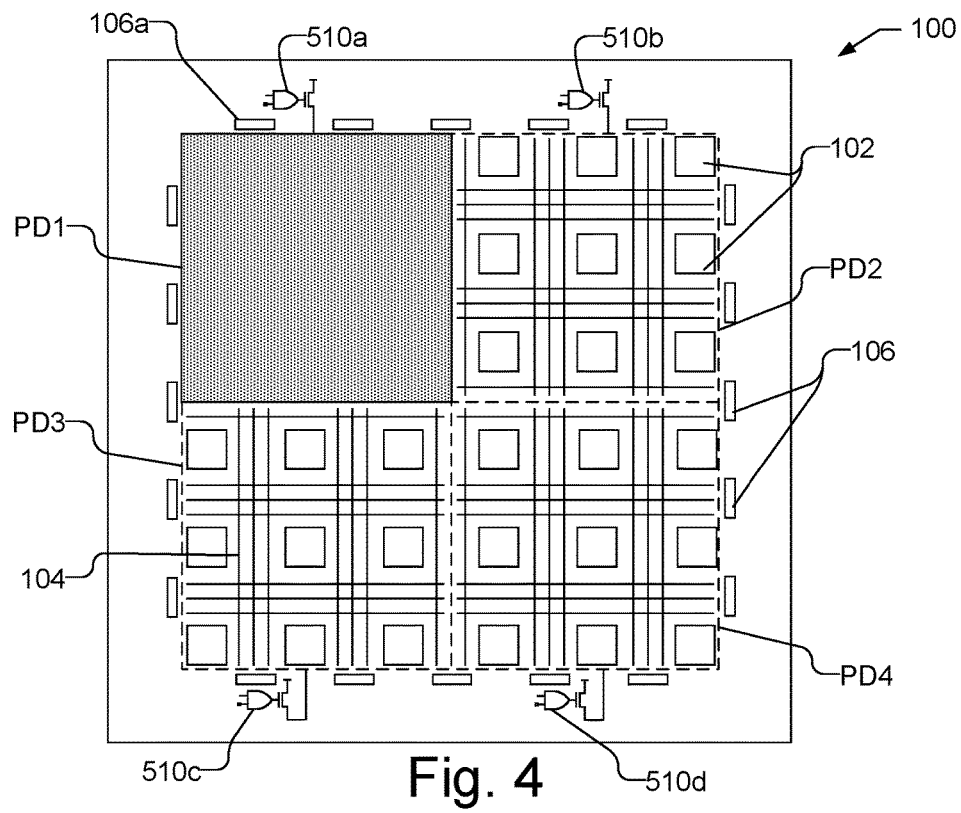

By way of example of switchable power islands, power island PD1 in the programmable logic device 100 may be powered OFF during a specific slot of time T_k, e.g., to reduce power consumption, while power islands PD2, PD3, and PD4 remain powered ON during that time. FIG. 4, for example, illustrates programmable logic device 100, e.g., during time T_k, during which power island PD1 is powered OFF, as indicated by power island PD1 being grayed out, while the remaining power islands are powered ON, as indicated by power islands PD2, PD3, and PD4 not being grayed out. In the above situation, power islands PD2, PD3, and PD4 are relatively ON compared to power island PD1. A power island PDx is said to be relatively ON compared to another power island PDy if PDx has logic cells that are powered ON when logic cells of PDy are powered OFF.

The power islands may be dynamically switched on or off under the control of an on-board 310 or off-board PMU 110, as illustrated in FIGS. 3 and 1, respectively. The PMU may dynamically control the power islands, e.g., based on a Power State Table (PST). A PST may contain a set of ON/OFF states of all the power islands at each time slot. By way of example, for the above-described situation, with power island PD1 dynamically powered OFF during time T_k while the remaining power islands remain powered ON, the entry in a PST used by an on-board or off board PMU may appear in Table 1. Moreover, as illustrated in the PST in FIG. 1, other power islands, such as power island PD2, may be dynamically powered OFF at other times, e.g., at time slot T_end, while the remaining power islands are powered ON as follows.

TABLE 1

| T/Island | PD1 (Dynamically controlled) | PD2 (Dynamically controlled) | PD3 | PD4 |
|---|---|---|---|---|
| ... | ... | ... | ... | ... |
| T_k | OFF | ON | ON | ON |
| ... | ... | ... | ... | ... |
| T_end | ON | OFF | ON | ON |

Additionally, power islands may be statically powered ON or OFF, e.g., the power islands may be set to be powered ON or OFF using a configuration bit that may be set when the programmable logic device is programmed with the desired circuit design.

Figure 5:
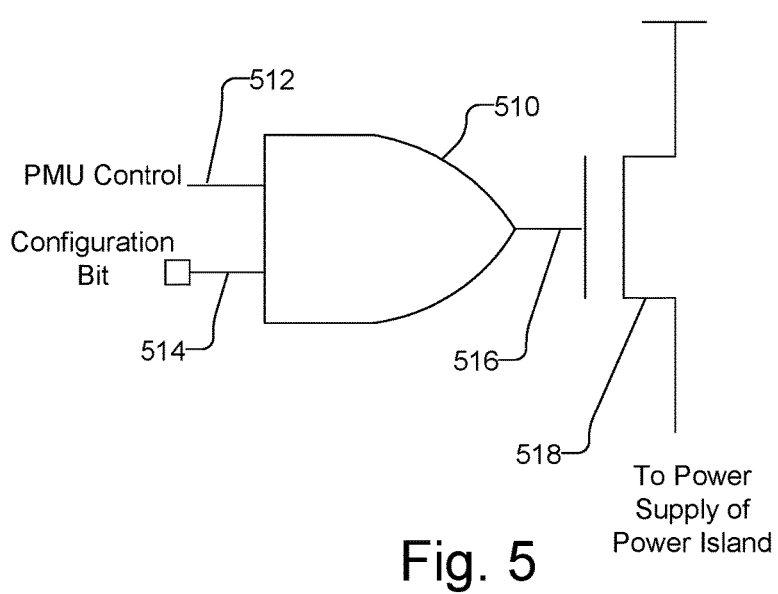
FIG. 5 illustrates combinatorial logic that may provide a dual power control for power islands in the programmable logic device.

FIG. 5, by way of example, illustrates combinatorial logic element, e.g., AND logic gate 510, that may provide a dual power control for power islands based on a configuration bit and a control signal from, e.g., a PMU. As illustrated, AND logic gate 510 includes an input terminal 512 that may be coupled to an off-board PMU 110 via I/O terminal 112 (illustrated in FIG. 1) or on-board PMU 310 (illustrated in FIG. 3) for PMU control and another input terminal 514 that is coupled to a configuration bit, which may be set when the programmable logic device is programmed with the desired circuit design. The output terminal 516 of the AND logic gate 510 is provided to control the power supplied to the power island, e.g., via a switch 518. Each power island may be associated with a separate combinatorial logic element, such as AND logic gate 510, that controls the power supply for the power island, as illustrated by AND logic gates 510a, 510b, 510c, and 510d in FIG. 4. Thus, for example, the configuration bit at terminal 514 of AND logic gate 510 may be set low to set a power island to be statically powered OFF. The configuration bit at terminal 514 of AND logic gate 510 may be set high and the PMU may control the power island to be powered ON with a high control signal at terminal 512 or dynamically powered OFF with a low control signal at terminal 512.

As illustrated in FIG. 4 by the entire power island PD1 being grayed out, all the logic cells and routing connectors in power island PD1 are powered OFF. When routing connectors, sometimes referred to as routing paths, are powered OFF, they may not be used to transmit signals and therefore cannot interconnect logic blocks or peripheral logic. There may be situations, however, where power islands PD2 and PD3 are required to communicate with each other while power island PD1 is powered OFF, e.g., during time T_k, and the only available routing path between power islands PD2 and PD3 is through power island PD1. Thus, it may be desirable for a routing path within power island PD1 that connects power islands PD2 and PD3 to be powered ON while power island PD1 itself is powered OFF.

Additionally, there may be situations where power island PD1 is powered OFF but peripheral logic 106 that are adjacent to power island PD1, such as I/O terminal 106a, may need to be accessed by other power islands, such as power island PD3. The number of peripheral logic 106 is limited in programmable logic device 100. Accordingly, it is important to ensure maximum utilization of the peripheral logic 106 by allowing access of any peripheral logic 106 at any location to any circuit component inside any power island. Therefore, while it may be desirable to dynamically or statically power OFF a power island, such as power island PD1, it may not be desirable avoid using certain peripheral logic or to dynamically lose connectivity to certain peripheral logic when their adjacent power islands are powered OFF. Thus, it may be desirable for a routing path within power island PD1 that connects I/O terminal 106a to power island PD3 to be powered ON while power island PD1 itself is powered OFF.

Figure 6:
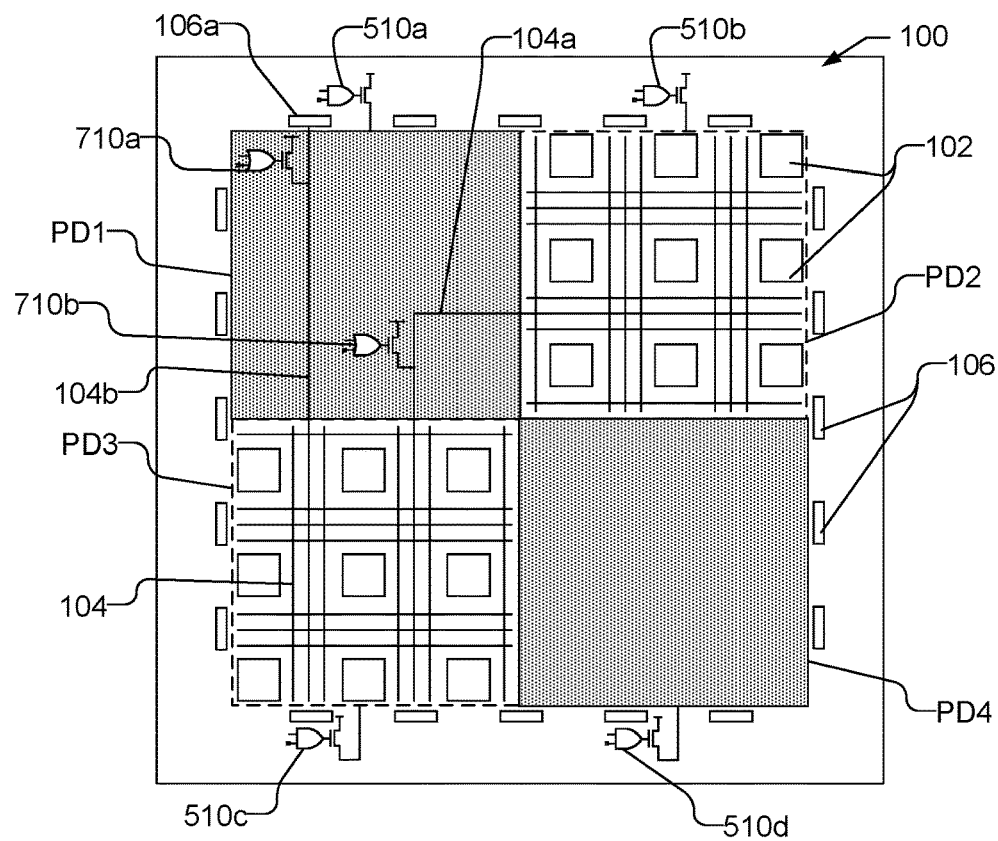
FIG. 6 illustrates a programmable logic device with two power islands powered OFF and with configurably ON routing paths connecting powered ON power islands and peripheral logic.

FIG. 6 illustrates programmable logic device 100, similar to that shown in FIG. 4, e.g., in which power islands PD1 and PD4 are powered OFF. As illustrated in FIG. 6, however, routing paths, such as routing path 104a and 104b, may be powered ON despite being located in a power island that is powered OFF, as indicated by power island PD1 in FIG. 6 being grayed out. For example, one or more of the routing paths may be statically powered ON (sometimes referred to herein as always-ON) even when the associated power island is powered OFF, e.g., if the power island is statically or dynamically powered OFF. Additionally, one or more routing paths may be switchably controlled to be dynamically powered ON or OFF (sometimes referred to herein as dynamically ON) when the associated power island is powered OFF, e.g., when the power island is statically powered OFF. In one implementation, the one or more routing paths may be switchably controlled to be dynamically powered ON or OFF in sync with the dynamic power control of the associated power island, e.g., the routing paths and the associated power island are controlled by the same PMU control signal. In another implementation, the one or more routing paths may be switchably controlled to be dynamically powered ON or OFF independently of the dynamic power control of the associated power island, e.g., the routing paths and the associated power island are controlled by different PMU control signals. Thus, as illustrated in FIG. 6, the routing paths 104a and 104b in power island PD1 may both be powered ON to respectively connect power island PD2 with power island PD3 and I/O terminal 106a with power island PD 3, despite power island PD1 being powered OFF. The routing paths 104a and 104b may be statically powered ON (or OFF) or may be dynamically powered ON or OFF, e.g., under the control of on-board PMU 310 or off-board PMU 110, illustrated in FIGS. 3 and 1, respectively.

It should be understood that, while FIG. 6 illustrates only two routing paths 104a and 104b that are powered ON while power island PD1 is powered OFF, all or a subset of routing paths within each power island may be controlled to be powered ON while the associated power island is powered OFF. For example, all or a subset of all the highway routing resources between logic blocks within a power island, or between power islands, or to peripheral logic may be statically or dynamically controlled to be powered ON or OFF. Moreover, all or a subset of routing paths within a power island may be dynamically controlled as a group, e.g., the dynamically controllable routing paths in each power island may be controlled by the same PMU control signal. In another implementation, all or a subset of routing paths within a power island may be dynamically controlled individually, e.g., each dynamically controllable routing path in each power island may be controlled by a different PMU control signal. For example, as illustrated in FIG. 6, routing paths 104a and 104b (as well as other routing paths in power island PD1) may be controlled to be dynamically powered ON together or may be dynamically powered ON separately.

The PMU may dynamically control the power islands and routing paths in each power island based on a PST, which may contain a set of ON/OFF states of all the power islands and routing paths at each time slot. For example, as illustrated in Table 2, below, power islands PD1 and PD4 may be statically powered OFF, e.g., using configuration bits at input terminals of associated AND logic gates, while routing paths 104a and 104b within power island PD1, and the power island PD2 and PD3 are dynamically controlled by the PMU based on the PST of Table 2. It should be understood that, if desired, within power island PD4 routing paths (not shown) may be dynamically controlled to be powered ON or OFF independently of the dynamic control of routing paths 104a and 104b in power island PD1.

As illustrated by Table 2, at time slot T_m, power islands PD2 and PD3 are dynamically powered ON, and accordingly, routing paths 104a and 104b are dynamically powered ON. At a time slot T_n, however, power island PD3 is dynamically powered OFF, and accordingly, the routing path 104a between power islands PD2 and PD3 and the routing path 104b between I/O terminal 106a and power island PD3 are no longer necessary. Accordingly, during time slot T_n, the routing paths 104a and 104b may be dynamically controlled to be powered OFF by the PMU 110 or 310. At a time slot T_end, on the other hand, power island PD2 is dynamically powered OFF, while power island PD3 is dynamically powered ON, and accordingly, the routing path 104a between power islands PD2 and PD3 is unnecessary, but the routing path 104b between I/O terminal 106a and power island PD3 is necessary. Accordingly, during time slot T_end, routing path 104b is dynamically controlled to be powered ON by the PMU 110 or 310. Routing path 104a and routing path 104b, however, may be controlled by the same PMU control signal, and accordingly, routing path 104a is likewise dynamically controlled to be powered ON. If, on the other hand, routing path 104a and routing path 104b, were to be controlled by different PMU control signals, routing path 104a may be dynamically controlled to be powered OFF during time slot T_end, while routing path 104b is dynamically controlled to be powered ON. Additionally, one or more routing paths may be statically powered ON. Thus, for example, routing path 104b may be statically controlled, and accordingly, would be powered ON in every time slot in Table 2. Routing path 104a may then be dynamically controlled to be powered OFF in time slot T_end.

TABLE 2

| T/Island | PD1 (Statically controlled) | Routing Path 104a (Dynamically controlled) | Routing Path 104b (Dynamically controlled) | PD2 (Dynamically controlled) | PD3 (Dynamically controlled) | PD4 (Statically controlled) |
|---|---|---|---|---|---|---|
| ... | ... | ... | ... | ... | ... | ... |
| T_m | OFF | ON | ON | ON | ON | OFF |
| T_n | OFF | OFF | OFF | ON | OFF | OFF |
| ... | ... | ... | ... | ... | ... | ... |
| T_end | OFF | ON | ON | OFF | ON | OFF |

In a programmable logic device, all the logic cells and routing wires are pre-fabricated on the device. Accordingly, on the fly synthesis and the P & R tool cannot add any additional logic or routing connectors to a programmable logic device. The P & R tool must use only the available logic cells and routing connectors to program the programmable logic device to perform a specific design implementation. Thus, feed-through routing connectors, e.g., highway routing resources between logic blocks within a power island, or between power islands, or to peripheral logic 106, in a programmable logic device may be required to be always ON in some design implementations, always OFF in other design implementations, and switchably powered ON and OFF in other design implementations. Hence, all feed-through routing connectors may be made configurable to be statically ON or dynamically ON or OFF with the control of the PMU.

Figure 7:
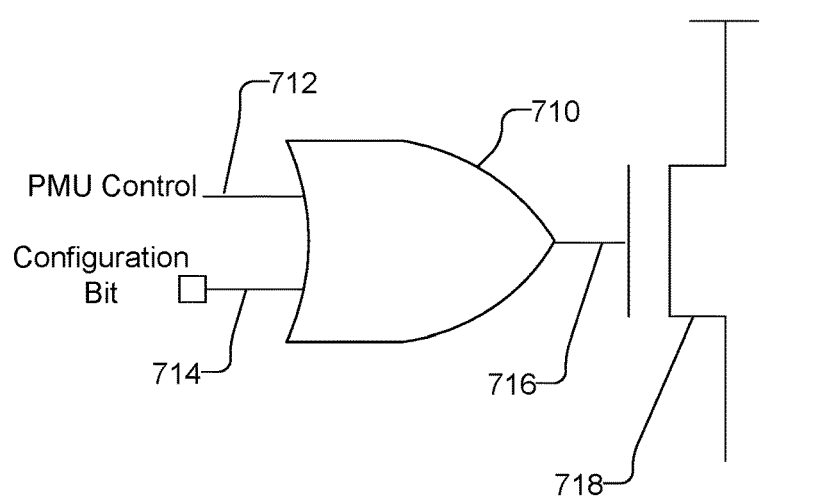
FIG. 7 illustrates combinatorial logic that may provide a dual power control for routing paths in the programmable logic device.

The one or more routing paths within a power island, for example, may be configured to be statically powered ON or dynamically powered ON or OFF using a combinatorial logic element, such as an OR logic gate. FIG. 7, by way of example, illustrates an OR logic gate 710, that may provide a dual power control for routing paths. As illustrated, OR logic gate 710 includes an input terminal 712 that may be coupled to an off-board PMU 110 (via I/O terminal 112) or on-board PMU 310 for PMU control and another input terminal 714 that is coupled to a configuration bit, which may be set when the programmable logic device is programmed with the desired circuit design. The output terminal 716 of the OR logic gate 710 is provided to control the power supplied to the routing connector, e.g., via a switch 718. Thus, for example, the configuration bit at terminal 714 may be set to statically power ON a routing connector when the power island in which the routing connector is located is dynamically powered ON or OFF by the PMU, and a control signal from the PMU at terminal 712 may be used to dynamically power ON or OFF the routing connector when the power island in which the routing connector is located is statically powered OFF.

Each feed-through routing connector in the logic blocks or the power islands, e.g., highway routing resources, may be associated with a separate combinatorial logic element, such as an OR logic gate 710 that controls the power supply for the feed-through routing connector, as illustrated by OR logic gates 710a and 710b in FIG. 6. The input terminals 712 of each OR logic gate 710 in a power island may be coupled to receive the same PMU control signal, e.g., all of the routing connectors within a power island are controlled by the same PMU control signal. Alternatively, the input terminals 712 of all or a subset of all the OR logic gates 710 in a power island may be coupled to receive different PMU control signals, e.g., all or a subset of the routing connectors within a power island are separately controlled by the different PMU control signals. Moreover, the input terminals 712 of each OR logic gate 710 in a power island may be coupled to receive the same PMU control signal that is received by the input terminal 512 of the AND logic gate 510 for the associated power island, e.g., the routing connectors and associated power island are dynamically controlled by the same PMU control signal. Alternatively, the input terminals 712 of all or a subset of all the OR logic gates 710 in a power island may be coupled to receive PMU control signals that are different than the PMU control signal received by the input terminal 512 of the AND logic gate 510 for the associated power island, e.g., the routing connectors and associated power island are dynamically controlled independently.

With a two input combinatorial gate, such as OR logic gate 710, a pre-fabricated programmable logic device may configure always-ON feed-through paths based on the post-placed-and-routed design requirement, or dynamically control the power supply of the feed through paths, e.g., depending on the PMU controlled value. Thus, with this nominal change, the overall global routing structure of the programmable logic device remains the same, but is provided with the ability to provide communication channels through powered OFF power islands when required by a circuit design to be implemented on the programmable logic device.

Table 3 illustrates, as a further example, an implementation in which the power island PD1 and routing path 104 are dynamically controlled (routing path 104a may receive the same PMU control signal as the power island PD1) and routing path 104b is statically powered ON. As illustrated, at a time slot T_p, power islands PD1 (with routing path 104a) and PD2 are dynamically powered OFF, and power island PD3 is dynamically powered ON. The routing path 104b is statically powered ON providing interconnection between I/O terminal 106a and power island PD3.

TABLE 3

| T/Island | PD1 (Dyamically controlled) | Routing Path 104a (Dynamically controlled) | Routing Path 104b (Statically controlled) | PD2 (Dynamically controlled) | PD3 (Dynamically controlled) | PD4 (Statically controlled) |
|---|---|---|---|---|---|---|
| ... | ... | ... | ... | ... | ... | ... |
| T_o | ON | ON | ON | ON | ON | OFF |
| T_p | OFF | OFF | ON | OFF | ON | OFF |
| ... | ... | ... | ... | ... | ... | ... |
| T_end | ON | ON | ON | ON | ON | OFF |

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A programmable logic device comprising:
a plurality of power islands, each power island comprising a plurality of programmable logic cells and a programmable routing network configurable to interconnect the plurality of programmable logic cells and configurable to interconnect with at least one other power island, wherein the plurality of power islands comprises:
at least one power island that is powered ON; and
a powered OFF power island, wherein the plurality of logic cells in the powered OFF power island are powered OFF and at least one routing connector in the programmable routing network of the powered OFF power island is powered ON.

2. The programmable logic device of claim 1, wherein the at least one routing connector in the programmable routing network of the powered OFF power island that is powered ON interconnects a first power island that is powered ON with a second power island that is powered ON.

3. The programmable logic device of claim 1, further comprising an input/output terminal, wherein the at least one routing connector in the programmable routing network of the powered OFF power island that is powered ON interconnects a first power island that is powered ON with the input/output terminal.

4. The programmable logic device of claim 1, further comprising a random access memory, wherein the at least one routing connector in the programmable routing network of the powered OFF power island that is powered ON interconnects a first power island that is powered ON with the random access memory.

5. The programmable logic device of claim 1, wherein the plurality of power islands are coupled to receive control signals from a power management unit (PMU) to dynamically switch the plurality of power islands into a powered ON state or a powered OFF state.

6. The programmable logic device of claim 5, wherein the PMU is an off-board PMU, the programmable logic device further comprising an input/output terminal for receiving the control signals from the off-board PMU the input/output terminal being coupled to provide the control signals to the plurality of power islands.

7. The programmable logic device of claim 5, wherein the PMU is an on-board PMU that is coupled to provide the control signals to the plurality of power islands.

8. The programmable logic device of claim 5, wherein the PMU uses a Power State Table to dynamically switch the plurality of power islands into the powered ON state or the powered OFF state.

9. The programmable logic device of claim 5, further comprising a plurality of combinatorial logic elements, wherein each combinatorial logic element has a first input terminal coupled to the PMU and a second input terminal coupled to a configuration bit, and an output terminal coupled to a power supply of a routing connector in the programmable routing network of each of the plurality of logic blocks or each of the plurality of power islands, wherein the configuration bit is set to power ON the routing connector when the power island in which the routing connector is located is dynamically powered ON or OFF by the PMU.

10. The programmable logic device of claim 5, further comprising a plurality of combinatorial logic elements, wherein each combinatorial logic element has a first input terminal coupled to the PMU and a second input terminal coupled to a configuration bit, and an output terminal coupled to a power supply of a routing connector in the programmable routing network of each of the plurality of logic blocks or each of the plurality of power islands, wherein a control signal from the PMU on the first input terminal is set to power ON or OFF the routing connector when the power island in which the routing connector is located is statically powered OFF by the configuration bit.

11. A programmable logic device comprising:
a plurality of programmable logic cells; and
a programmable routing network configurable to interconnect the plurality of programmable logic cells;
wherein the plurality of programmable logic cells and the programmable routing network is partitioned into a plurality of power islands, wherein the programmable logic cells within a power island are powered OFF when the power island is in a powered OFF state, and wherein feed-through routing connectors in the programmable routing network within the power island are configurable to statically or dynamically be powered ON independently of the powered OFF state of the power island.

12. The programmable logic device of claim 11, wherein the feed-through routing connectors in the programmable routing network within the power island are configurable to connect a first separate power island that is powered ON with a second separate power island that is powered ON.

13. The programmable logic device of claim 11, further comprising an input/output terminal, wherein the feed-through routing connectors in the programmable routing network within the power island are configurable to connect a first separate power island that is powered ON with the input/output terminal.

14. The programmable logic device of claim 11, further comprising a random access memory, wherein the feed-through routing connectors in the programmable routing network within the power island are configurable to connect a first separate power island that is powered ON with the random access memory.

15. The programmable logic device of claim 11, wherein the plurality of power islands are coupled to receive control signals from a power management unit (PMU) to dynamically switch the plurality of power islands into a powered ON state or a powered OFF state or to dynamically control the feed-through routing connectors in the programmable routing network within the power islands to be powered ON independently of the powered OFF state of the power island.

16. The programmable logic device of claim 15, wherein the PMU is an off-board PMU, the programmable logic device further comprising an input/output terminal for receiving the control signals from the off-board PMU, the input/output terminal being coupled to provide the control signals to the plurality of power islands and the feed-through routing connectors in the programmable routing network within the power islands.

17. The programmable logic device of claim 15, wherein the PMU is an on-board PMU that is coupled to provide the control signals to the plurality of power islands and the feed-through routing connectors in the programmable routing network within the power islands.

18. The programmable logic device of claim 15, wherein the PMU uses a Power State Table to dynamically switch the plurality of power islands into the powered ON state or the powered OFF state or dynamically control the feed-through routing connectors in the programmable routing network within the power islands to be powered ON independently of the powered OFF state of the power island.

19. The programmable logic device of claim 15, further comprising a plurality of combinatorial logic elements coupled to the feed-through routing connectors in the programmable routing network within the power island, wherein each combinatorial logic element has a first input terminal coupled to the PM and a second input terminal coupled to a configuration bit and an output terminal coupled to a power supply of a feed-through routing connector to statically or dynamically power ON the feed-through routing connector independently of the powered OFF state of the power island.

* * * * *

UNITED STATES PATENT AND TRADEMARK OFFICE
CERTIFICATE OF CORRECTION

PATENT NO. : 10,148,270 B2
APPLICATION NO. : 15/658206
DATED : December 4, 2018
INVENTOR(S) : Pinaki Chakrabarti et al.

It is certified that error appears in the above-identified patent and that said Letters Patent is hereby corrected as shown below:

In the Claims

In Column 12, Line 38, in Claim 19, delete "PM" and insert --PMU--.

Signed and Sealed this
Tenth Day of December, 2019

Andrei Iancu
*Director of the United States Patent and Trademark Office*